United States Patent [19]

Saitoh

[11] Patent Number: 5,564,088
[45] Date of Patent: * Oct. 8, 1996

[54] BROADCAST SIGNAL RECEIVER WITH MEANS FOR PRIORITIZING BROADCAST SIGNALS BASED ON PREVIOUS SELECTIONS THEREOF

[75] Inventor: Mitsumasa Saitoh, Kanagawa, Japan

[73] Assignee: Sony Corporation, Tokyo, Japan

[ * ] Notice: The portion of the term of this patent subsequent to Jun. 21, 2011, has been disclaimed.

[21] Appl. No.: 219,470

[22] Filed: Mar. 29, 1994

Related U.S. Application Data

[63] Continuation-in-part of Ser. No. 11,422, Jan. 29, 1993, Pat. No. 5,323,240.

[30] Foreign Application Priority Data

Mar. 31, 1993 [JP] Japan ..................................... 5-073891

[51] Int. Cl.⁶ .................................................. H04N 5/50
[52] U.S. Cl. ...................... 455/186.1; 348/734; 348/906; 348/731
[58] Field of Search .............................. 455/179.1, 181.1, 455/185.1, 186.1, 734, 906, 186.2; 348/460, 906, 731; 358/191.1

[56] References Cited

U.S. PATENT DOCUMENTS

| | | | |
|---|---|---|---|
| 4,187,469 | 2/1980 | Tanaka | 455/180.1 |
| 5,323,240 | 6/1994 | Amano et al. | 348/731 |
| 5,444,499 | 8/1995 | Saitoh | 348/734 |

FOREIGN PATENT DOCUMENTS

| | | | |
|---|---|---|---|
| 4162816 | 6/1992 | Japan | 455/179.1 |

Primary Examiner—Andrew Faile
Attorney, Agent, or Firm—William S. Frommer; Alvin Sinderbrand

[57] ABSTRACT

Broadcast signal channel selecting apparatus which receives and is tunable to different broadcast signals, assigns a priority to each as a function of the amount of time to which that broadcast signal had been previously tuned, selects a broadcast signal according to its priority, and tunes to the selected broadcast signal.

18 Claims, 4 Drawing Sheets

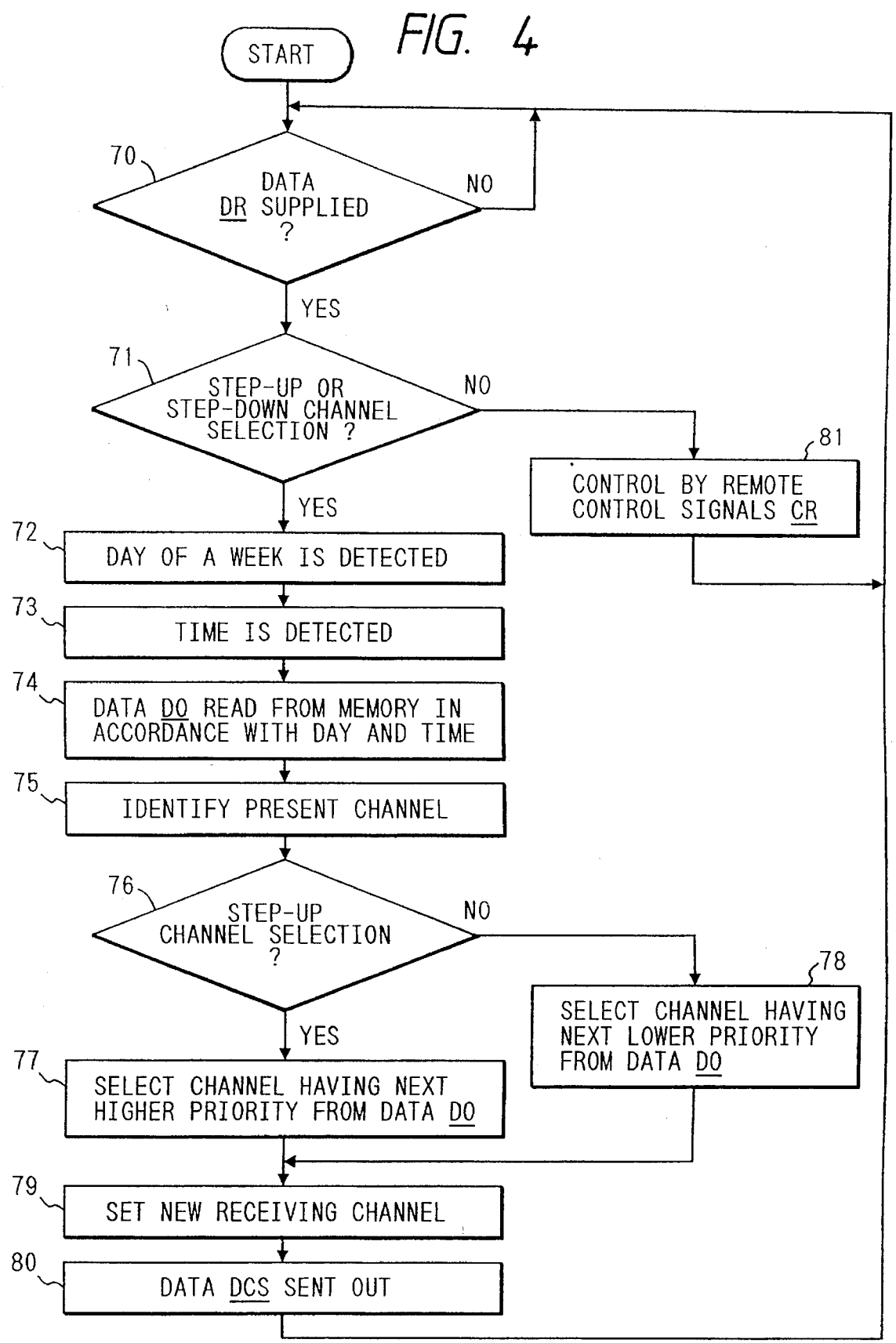

BROADCAST SIGNAL RECEIVER WITH MEANS FOR PRIORITIZING BROADCAST SIGNALS BASED ON PREVIOUS SELECTIONS THEREOF

RELATED APPLICATION

This is a continuation-in-part of U.S. patent application 08/011,422, filed Jan. 29, 1993, which issued as U.S. Pat. No. 5,323,240 on Jun. 21, 1994.

BACKGROUND OF THE INVENTION

The present invention relates to broadcast signal channel selecting apparatus and, more particularly, to apparatus for selecting a broadcast signal in accordance with a priority of each of the broadcast signals determined by previous selections of the broadcast signals.

As is known, television receivers receive broadcast signals via antenna or cable that have been transmitted by a broadcast station and employ a channel selecting device to select one of the received signals for viewing by a user. The channel selecting device includes a tuner which is "tuned" to one of the carrier frequencies received by the television receiver, discriminates that carrier frequency from the other carrier frequencies, and supplies the broadcast signal contained within that carrier frequency to the television monitor for viewing. A tuner controller is operative to control the tuner by supplying control signals which indicate which broadcast signal is to be selected by the tuner.

One known tuner controller is of the type which has a number of push-buttons which are depressed by a television viewer to select the broadcast signal to be displayed on the television monitor. One such push-button is depressed to "step-up" the channel selection, supplying a pulse train to the tuner causing the tuner to tune to the next higher carrier frequency from the carrier frequency to which it currently is tuned. That is, the up-channel push-button is depressed to increase the channel number by one. Similarly, a down-channel push-button is depressed to "step-down" the selection of the tuner by tuning to the next lower carrier frequency from the carrier frequency to which the tuner currently is tuned. An advantage to having two push-buttons, one to initiate "step-up" the other to initiate "step-down" is that any received carrier frequency (i.e. channel) may be selected by Using only these two push-buttons.

One disadvantage with a television receiver employing the above-described push-buttons is that a user must often "cycle" through channels which are not desired to be viewed before selecting the ultimate channel when changing channels by means of one of these two push-buttons. Since it is common for a viewer to watch the same television program at a specific time and day, thereby selecting the same channel (e.g. channel 4) at the same time and day of each week (e.g. 8:00 p.m. on Sunday), and it is common for that viewer to watch another television program on a second channel (e.g. channel 9) immediately after viewing the first program (e.g. 9:00 p.m. on Sunday), the viewer is forced to cycle through undesired channels (e.g. channels 5, 6, 7 and 8) when using one of the two above-described push-buttons when selecting the second channel.

Another disadvantage with the television receiver employing the above-described two push-buttons for step-up and step-down, is that the television receiver and the channel selecting device do not assist the viewer in selecting the most commonly viewed channels at a specified time of day of the week and thus, the viewer may need to refer to a television program time schedule, commonly known as a television guide, to determine which channel is to be viewed.

OBJECTS OF THE INVENTION

Therefore, it is an object of the present invention to provide broadcast signal channel selecting apparatus which overcomes the shortcomings of the above-described device.

Another object of the present invention is to provide broadcast signal channel selecting apparatus which allows a viewer to change the channel to a preferred channel without cycling through channels which are not desired to be viewed.

A further object of the present invention is to provide broadcast signal channel selecting apparatus which selects a channel that is commonly viewed at a particular time and day of the week.

Various other objects, advantages and features of the present invention will become readily apparent to those of ordinary skill in the art, and the novel features will be particularly pointed out in the appended claims.

SUMMARY OF THE INVENTION

In accordance with one embodiment of the present invention, broadcast signal channel selecting apparatus operates to receive broadcast signals, assign a priority to each of the broadcast signals which corresponds to the number of times each of the broadcast signals had been previously selected, select one of the broadcast signals having the next higher or lower priority and supply the selected broadcast signal as an output (e.g. to a television monitor).

In accordance with another embodiment of the present invention, broadcast signal channel selecting apparatus operates to receive broadcast signals, assign a priority to each broadcast signal for each time period (e.g. time period of day of week) which corresponds to the number of times that broadcast signal had been previously selected during that time period, select the broadcast signal having the highest priority for the current time period and supply the selected broadcast signal as an output.

As one aspect of the present invention, the broadcast signal having the highest priority for the current time period is automatically selected at the beginning of the current time period and supplied as an output.

BRIEF DESCRIPTION OF THE DRAWINGS

The following detailed description, given by way of example and not intended to limit the present invention solely thereto, will best be appreciated in conjunction with the accompanying drawings, wherein like reference numerals denote like elements and parts, in which:

FIG. 4 is a flow chart of the routine executed by the control unit of the channel selecting apparatus in accordance with another embodiment of the channel selection operation of the present invention.

DETAILED DESCRIPTION OF CERTAIN PREFERRED EMBODIMENTS

Figure 1:
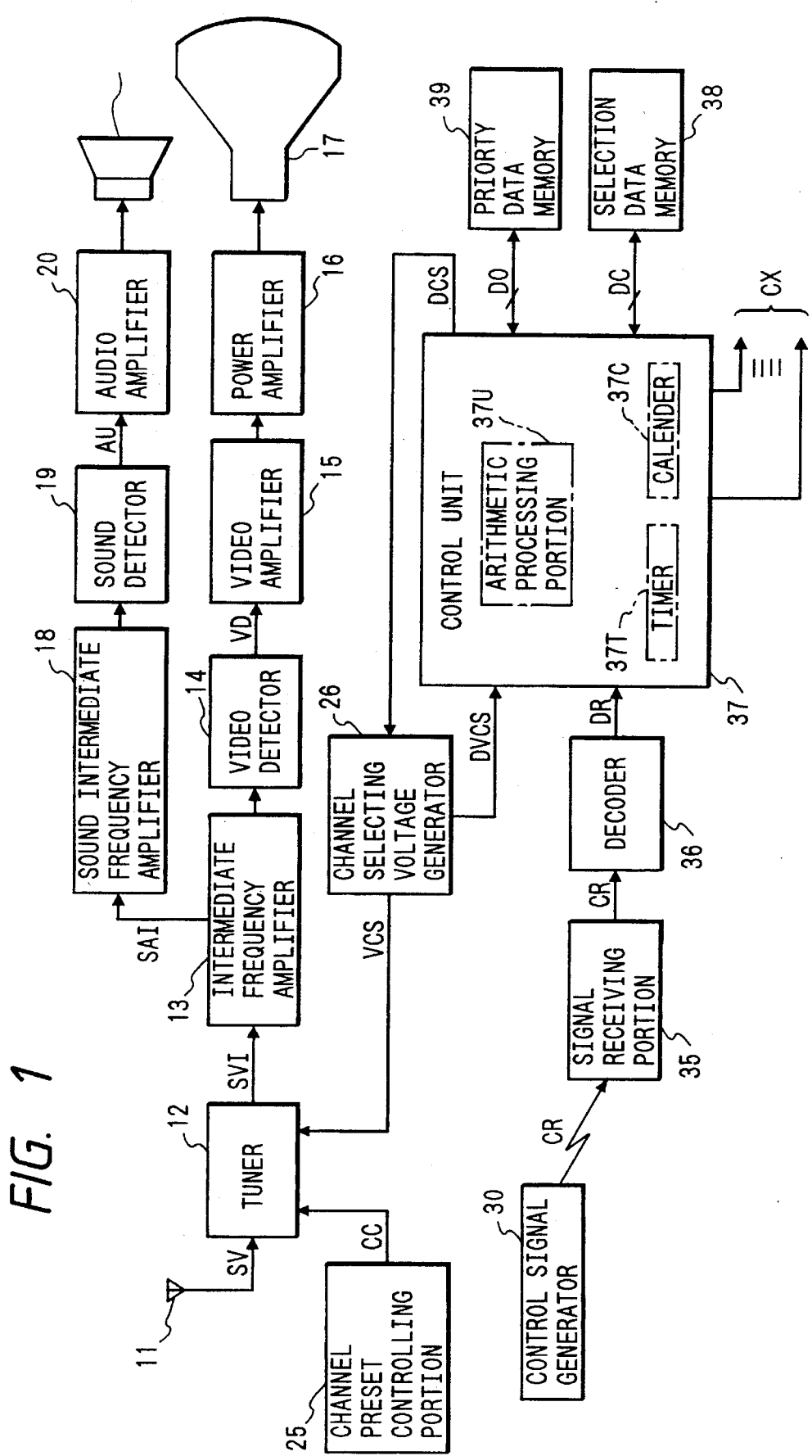
FIG. 1 is a block diagram of a television receiver employing broadcast signal channel selecting apparatus in accordance with the present invention.

Referring now to the drawings, FIG. 1 is a block diagram of a television receiver employing broadcast signal channel selecting apparatus according to the present invention and is comprised of a television signal antenna 11, a tuner 12, a video channel including a video monitor 17, a sound channel including a speaker 21, a channel preset controller 25, a channel selecting voltage generator 26 and a control unit 37.

Television broadcast signals transmitted from broadcast stations are received by antenna 11 which supplies these signals (SV) to the tuner 12. The broadcast signals may also be received via a cable (not shown). The tuner is operable to tune to any one of the frequencies carrying the broadcast signals (commonly referred to as broadcast channels) and is controlled by a control signal CC generated by the channel preset controller 25, allowing the tuner to "tune" to any one of a number of predetermined television broadcast channels, each channel corresponding to a broadcast frequency received by antenna 11. The signal CC provided by the channel preset controller 25 prevents the tuner 12 from tuning to a frequency which does not carry a broadcast signal.

The tuner is controlled by a signal VCS supplied by the channel selecting voltage generator 26 to select a particular broadcast channel. That is, the tuner 12 tunes to channel 2, for example, when signal VCS is at one value and tunes to channel 4, for example, when signal VCS is at a second value. The tuner supplies the broadcast signal SVI to which it is tuned to an intermediate frequency amplifier 13 in the video channel which amplifies the broadcast signal before supplying it to a video detector 14. The video detector then demodulates the broadcast signal to produce a video signal VD which is supplied to a video amplifier 15, a power amplifier 16 and then to the video monitor 17 (e.g. cathode ray tube) for viewing.

The intermediate frequency amplifier 13 supplies a sound intermediate frequency signal SAI, that is separated from the broadcast signal SVI supplied by the tuner 12, to a sound intermediate frequency amplifier 18 of the audio channel. The sound IF signal is amplified and supplied to a sound detector 19 which demodulates the sound IF signal to produce an audio signal AU which is supplied to speaker 21 through an audio amplifier 20.

In accordance with the present invention, the channel selecting voltage generator is controlled by control unit 37 which contains an arithmetic processing portion 37U, a timer 37T and a calendar 37C. The control unit receives a signal DVCS from channel selecting voltage generator 26 which identifies the broadcast channel being selected; for example, the signal DVCS may be a digital number corresponding to the value of the signal VCS supplied to tuner 12. In a preferred embodiment of the invention, control unit 37 detects the selected channel (e.g. it samples the channel identifying signal DVCS) at predetermined intervals, for example, at five minute intervals. The timer 37T and the calendar 37C supply time and day information, respectively, such that the control unit associates each specific time and day with the broadcast channel that is selected during that specific time and day. The control unit counts the number of times each broadcast channel is selected during each predetermined period of a day. In the preferred embodiment of this invention, each period corresponds to an exclusive thirty minute time interval of each day of a week since television programs and movies typically have lengths corresponding to multiples of thirty minute time intervals, for example, lengths of 30, 60, 90 and 120 minutes. Arithmetic processing portion 37U ascertains the number of times each broadcast channel is selected during a thirty minute interval, and supplies this data (DC) to a selection data memory 38 (e.g. a random access memory).

Control unit 37 establishes the priority of each broadcast channel during a respective thirty minute time interval based upon the selection data DC stored in selection data memory 38, assigning the highest priority to the broadcast channel having the greatest number of times of selection during the respective period and assigning lower priorities to broadcast channels having lesser number of times of selection during the respective period. Since a viewer typically watches the same programs each week, and particular programs usually are broadcast at the same time period on the same day of each week, the broadcast channel which is assigned the highest priority generally will represent the channel which the viewer would prefer to watch at that specific time and day of the week. In addition, since a viewer's preference may change, it is advantageous for the control unit to continue to detect the broadcast channel which is selected during each period and update selection data memory 38 accordingly. Control unit 37 stores priority information DO in a priority data memory 39 (e.g. a random access memory).

As also shown in FIG. 1, a control signal generator 30, which may be in the form of a remote control device or manually operated device located within the channel selecting device (e.g. within the chassis of the television receiver), supplies to a signal receiving portion 35 a control signal CR in accordance with the operations performed by the viewer. These operations may include channel selection, modifying the volume, programming the television receiver, power on/off, etc. Control signal CR having a characteristic corresponding to a respective operation, is supplied to a decoder 36 which decodes the control signal CR and supplies the decoded signal DR to control unit 37.

Figure 2:
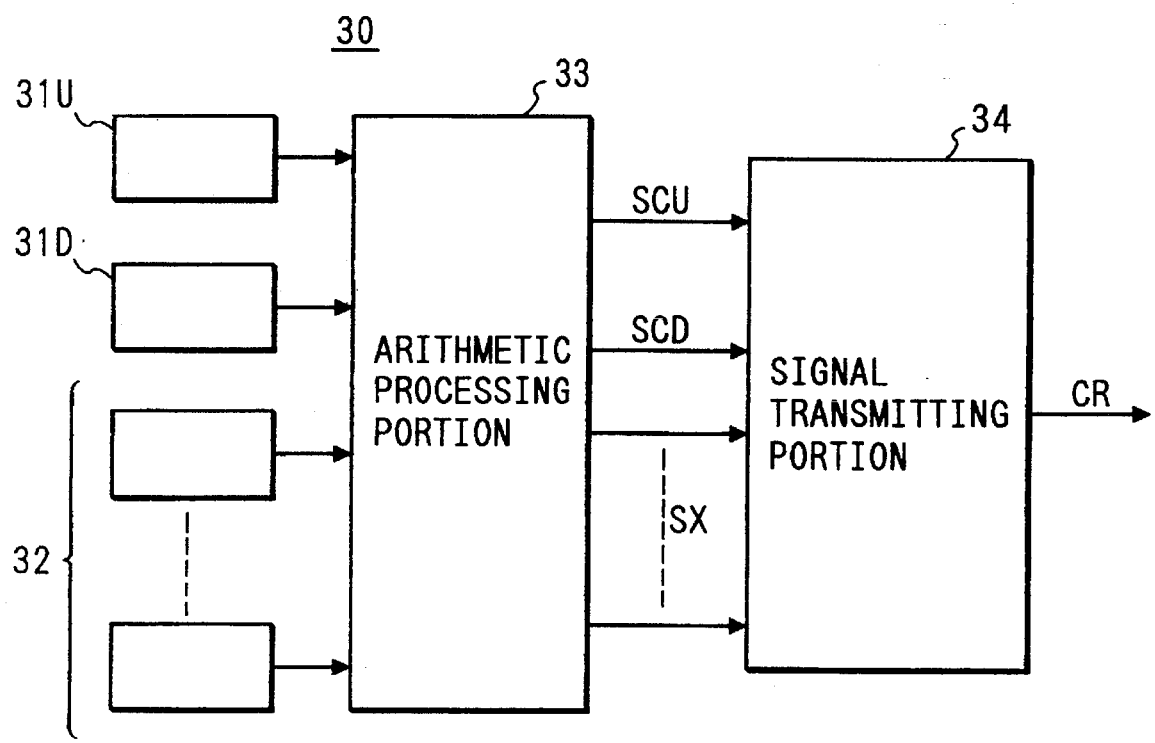
FIG. 2 is a block diagram of the control signal generator of the broadcast signal channel selecting apparatus of FIG. 1.

FIG. 2 is a block diagram of one embodiment of control signal generator 30 which includes push-buttons (or switches) 31U, 31D and 32, an arithmetic processing portion 33 and a signal transmitting portion 34. Typically, a viewer depresses push-button 31U or 31D to step up or step down, respectively, the selection of a broadcast channel. Push-buttons 32 are utilized by a viewer to perform other functions associated with the operation of the television receiver, for example, volume control, programming, power on/off, etc. The signals produced by the push-buttons are supplied to arithmetic processing portion 33 which produces control signals SCU, SCD and SX. These control signals are supplied to signal transmitting portion 34 which, in turn, transmits to the signal receiving portion 35 (FIG. 1) a control signal CR corresponding to the produced control signals. For example, control signal SCU is supplied to the signal transmitting portion 34 when push-button 31U is depressed initiating the step up channel selection, control signal SCD is supplied to the signal transmitting portion when push-button 31D is depressed initiating step down channel selection, and control signals SX are supplied when one of the push-buttons 32 is depressed.

Returning to FIG. 1, the transmitted control signal CR is decoded by decoder 36 and applied to control unit 37 which performs the step up channel selection process and the step down channel selection process. If the user depresses one of push-buttons 32, the control unit supplies corresponding control signals CX to other portions of the television receiver. When the viewer depresses push-button 31U (FIG. 2), the control unit retrieves the priority data DO, indicating the respective priority of all of the broadcast channels, from priority data memory 39 corresponding to the current time and day of the week indicated by timer 37T and calendar 37C, respectively. From the priority data DO, the control unit identifies a high priority broadcast channel having a carrier frequency higher than the carrier frequency of the currently selected broadcast channel (as represented by DVCS). That is, a broadcast channel that is at least sometimes viewed during the current time period is identified. Control unit 37 supplies to channel selecting voltage generator 26 a channel selection signal DCS representing the identified broadcast channel in order to select the identified channel. The channel selecting voltage generator then supplies to tuner 12 the channel selecting voltage signal VCS corresponding to the channel selection signal DCS, causing the tuner to tune to the broadcast signal of the selected broadcast channel.

Similarly, the step down channel selection process is initiated when the viewer depresses push-button 31D. Control unit 37 selects a broadcast channel in a similar manner as the step up channel selection process, except that a high priority broadcast channel having a carrier frequency lower than the carrier frequency of the currently selected broadcast channel is selected.

In another embodiment of the present invention, broadcast channels having a very high priority, e.g. only those channels that are most often selected during the current time and day, are selected during the step up and step down channel selection processes. In accordance with a further embodiment, broadcast channels having lower priorities may be selected when the viewer depresses push-buttons 31U or 31D, but these channels are selected in descending order of priorities such that higher priority channels are selected before lower priority channels. Consequently, broadcast channels that are never selected or that are rarely selected may be avoided when changing channels.

In another embodiment, the broadcast signal channel selecting apparatus automatically selects the broadcast channel having the highest priority for the current time and day of the week. In this embodiment, the operation of control unit 37, selection data memory 38, priority data memory 39, channel selecting voltage generator 26 and tuner 12 are essentially the same as the embodiments described above, except that here the control unit automatically selects the channel having the highest priority in a specific time period (e.g. 30 minutes) when that new time period begins. For example, the broadcast channel having the highest priority (e.g., channel 7) for the period of 8:00 p.m. to 8:30 p.m. on Sunday, is automatically selected at 8:00 p.m. on Sunday. A viewer still may manually select a channel via control signal generator 30 (i.e. remote control unit) and may also disable the automatic channel selecting operation so as to allow uninterrupted viewing of a channel other than this highest priority broadcast channel.

In a further embodiment of the present invention, the broadcast channel having the highest priority for the particular time period is selected by control unit 37 when viewing is initiated by the viewer. That is, when the television receiver employing the broadcast signal channel selecting apparatus of the present invention is turned on, the most preferred channel (i.e. the channel having the highest priority for the current time period) is automatically selected. This prevents the viewer from unnecessarily selecting the automatically selected channel when viewing is initiated.

Figure 3:
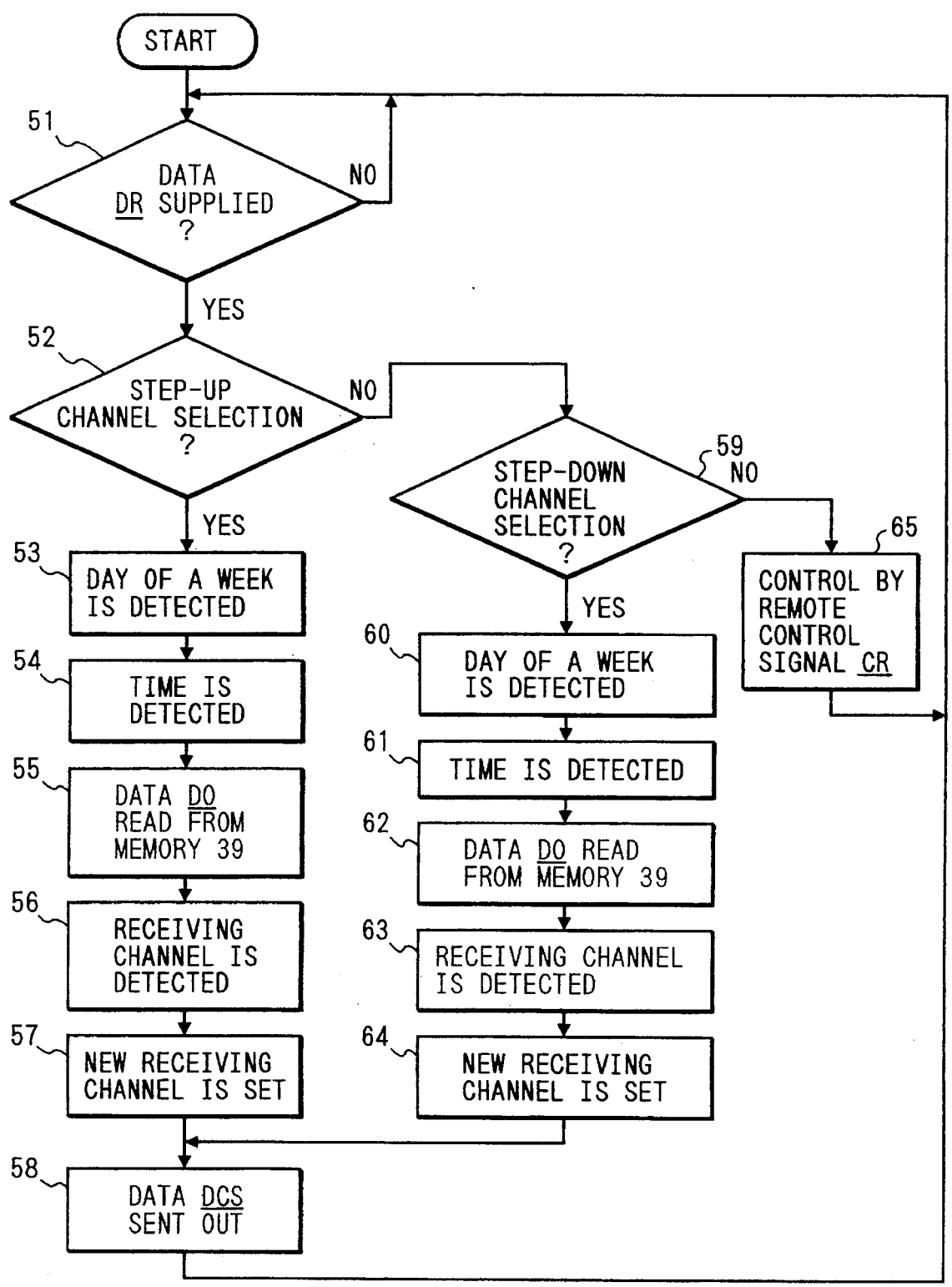
FIG. 3 is a flow chart of the channel selection operation of the present invention.

FIG. 3 is a flow chart illustrating the manner in which control unit 37 operates to control tuner 12 in accordance with the present invention. At inquiry 51, the control unit determines whether the control signal DR is being supplied to it, that is, whether a viewer operates a push-button on control signal generator 30, and repeats this detection until one of the push-buttons is depressed. Once the control signal DR is supplied, it is determined at inquiry 52 whether the step-up channel operation is selected. If the viewer had depressed push-button 31U (FIG. 2), thereby selecting the step-up operation, inquiry 52 is answered in the affirmative and the current day of the week and the current time of day are ascertained by instructions 53 and 54, respectively. At instruction 55, the priority data DO which identifies the respective priority of all of the broadcast channels corresponding to the time period of the current time and day is retrieved from priority data memory 39. The control unit then advances to instruction 56 to detect the broadcast channel selected and received, as by sensing the identifying signal DVCS mentioned above. At instruction 57, arithmetic processing portion 37U of the control unit identifies a high priority broadcast channel having a carrier frequency higher than the carrier frequency of the presently received broadcast channel represented by identifying signal DVCS and produces a channel selection signal DCS to identify the above identified high priority broadcast channel. At instruction 58, the control unit supplies the channel selection signal DCS to channel selecting voltage generator 26, whereby the corresponding channel selecting voltage signal VCS is coupled to tuner 12. At this point, processing returns to inquiry 51.

If the viewer had depressed push-button 31D to initiate the step-down selection process, the routine performed by the control unit proceeds from inquiry 52 to inquiry 59 and then to instruction 60. The current day of the week and the current time of the day are ascertained by instructions 60 and 61, respectively, and at instruction 62 the priority data DO identifying the respective priority of all of the broadcast channels corresponding to the time period of the current time and day is retrieved from priority data memory 39. The control unit then advances to instruction 63 to detect the presently received broadcast channel and at instruction 64, arithmetic processing portion 37U identifies a high priority broadcast channel having a carrier frequency lower than the carrier frequency of the presently received broadcast channel. At instruction 58, the channel selection signal DCS corresponding to this broadcast channel is supplied to channel selecting voltage generator 26 whereupon the tuner is tuned thereto.

If the viewer depressed one of push-buttons 32 to control some other function of the television receiver, inquiry 51 is answered in the affirmative and inquiries 52 and 59 both are answered in the negative. As a result, the routine advances to instruction 62 where one of the other functions (e.g. volume change, programming etc.) is performed. The routine then returns to inquiry 51.

In another embodiment of the present instruction, which may also be described with reference to FIG. 3, when push-button 31U is depressed, control unit 37 identifies the broadcast channel (without regard to frequency) having the next immediately higher priority than the assigned priority of the broadcast channel to which tuner 12 presently is tuned at instruction 57. The control unit supplies to channel selecting voltage generator 21 a channel selection signal DCS representing the identified broadcast channel at instruction 58. As described above, the channel selecting voltage generator then supplies to tuner 12 the channel selecting voltage signal VCS corresponding to the channel selection signal DCS, causing the tuner to tune to the broadcast signal of the identified broadcast channel.

Similarly, if the viewer had depressed push-button 31D, control unit 37 at instruction 64 identifies a broadcast channel (also, without regard to frequency) having the next lower priority than the assigned priority of the broadcast channel to which the tuner presently is tuned.

The above-described channel selection routine of control unit 37 in accordance with the present invention will now be described with reference to the flow chart of FIG. 4. The routine commences with inquiry 70, whereat the control unit determines whether the control signal DR is being supplied to it. Once the control signal DR is supplied (i.e. a push-button is depressed), the routine advances to inquiry 71 to determine whether the step-up or step-down channel operations are selected. If the viewer had depressed push-button 31U or 31D, thereby selecting the step-up operation or the step-down operation, respectively, inquiry 71 is answered in the affirmative and the current day of the week and the current time of day are ascertained by instructions 72 and 73, respectively. The priority data DO is then retrieved from priority data memory 39 by instruction 74 and the currently selected broadcast channel is identified by instruction 75. Proceeding to inquiry 76, it is determined whether the step-up channel operation was initiated by the viewer. If the viewer had depressed push-button 31U, inquiry 76 is answered in the affirmative and at instruction 77 the arithmetic processing portion 37U identifies the broadcast channel having the next immediately higher priority than the assigned priority of the currently selected broadcast channel. Channel selection signal DCS is produced to identify the newly identified broadcast channel at instruction 79 and at instruction 80, the control unit supplies the channel selection signal DCS to channel selecting voltage generator 26, whereby the corresponding channel selecting voltage signal VCS is coupled to tuner 12. At this point, the routine returns to inquiry 70.

If the viewer had depressed push-button 31D to initiate the step-down selection process, the routine performed by the control unit proceeds from inquiry 76 to instruction 78, whereby the arithmetic processing portion 37U identifies the broadcast channel having the next immediately lower priority than the assigned priority of the currently selected broadcast channel. Channel selection signal DCS is produced to identify the new broadcast channel at instruction 79 and the channel selection signal DCS is sent out at instruction 80, causing the tuner to tune to the newly selected broadcast channel.

If the viewer depressed one of push-buttons 32 to control some other function of the television receiver, inquiry 71 is answered in the negative, advancing the routine to instruction 81 where one of the other functions is performed. The routine then returns to inquiry 70.

While the present invention has been particularly shown and described in conjunction with preferred embodiments thereof, it will be readily appreciated by those of ordinary skill in the art that various changes and modifications may be made without departing from the spirit and scope of the invention. For example, while a television receiver which receives broadcast signals is described, the present invention is not limited to television signals and may be used for selecting other types of broadcast signals, such as radio.

As another example, although the present discussion is directed to prioritizing channels according to the number of times a particular channel is selected, the present invention is not limited solely to prioritizing channels based upon this criterion and may prioritize channels based upon other standards, such as, for example, popularity of the programs or viewing styles of other individuals.

Still further, although priorities are established for thirty minute intervals of time, other time intervals may be easily utilized.

Therefore, it is intended that the appended claims be interpreted as including the embodiments described herein, the alternatives mentioned above, and all equivalents thereto.

What is claimed is:

1. Broadcast signal channel selecting apparatus, comprising:

means for receiving a plurality of broadcast signals;

means for assigning a respective priority to each of said plurality of broadcast signals in accordance with a respective amount of previous selection time of said each broadcast signal;

selection means operable to select one of said plurality of broadcast signals in accordance with the priorities assigned to the received broadcast signals; and tuning means tunable to the selected broadcast signal for supplying said selected broadcast signal as an output, said selection means being operable in both an up mode and a down mode to select other one of said broadcast signals having an assigned priority immediately lower in the down mode and immediately higher in the up mode than the assigned priority of the broadcast signal to which said tuning means presently is tuned.

2. The apparatus of claim 1, wherein said means for assigning is operable to assign a highest priority to the one of said broadcast signals whose previous selection time is greatest.

3. The apparatus of claim 1, wherein said selection means is operable to initially select the one of said broadcast signals having the highest assigned priority when said broadcast signal channel selecting apparatus is turned on.

4. The apparatus of claim 1, wherein said selection means is operable to automatically select the one of said broadcast signals having the highest assigned priority.

5. The apparatus of claim 1, wherein said means for assigning includes detection means for detecting at predetermined time intervals the one of said broadcast signals to which said tuning means is tuned, and priority assigning means for assigning a respective priority to each of said broadcast signals as a function of the number of times said each broadcast signal is detected as said one broadcast signal to which said tuning means is tuned.

6. The apparatus of claim 5, wherein said priority assigning means is operable to assign a highest priority to the one of said broadcast signals that is detected the greatest number of times.

7. The apparatus of claim 1, wherein said broadcast signals include video and audio signals, and the output from said tuning means includes a video signal and an audio signal.

8. The apparatus of claim 1, wherein said means for assigning includes means for determining days of the week and time periods in each day, and means for assigning respective priorities to each of said broadcast signals for each time period in each day as a function of said respective amount of previous selection time of the respective broadcast signal during said time period, said selection means is operable to select one of said broadcast signals in accordance with the priority assigned to each of said broadcast signals for a current time period of a current day, and said tuning means is controlled to be tuned to the broadcast signal selected for said current time period.

9. The apparatus of claim 8, wherein said means for assigning assigns the highest priority for each time period to one of said broadcast signals whose selection time is greatest for that time period.

10. The apparatus of claim 8, wherein said selection means is further operable to automatically select the one of said broadcast signals having the highest assigned priority for said current time period.

11. The apparatus of claim 10, wherein said selection means automatically selects the one of said broadcast signals having the highest assigned priority only at a beginning of said current time period.

12. The apparatus of claim 8, wherein said means for assigning includes detection means for detecting at predetermined time intervals during said current time period the one of said broadcast signals to which said tuning means is tuned, and means for assigning a respective priority to each of said broadcast signals as a function of the number of times said each of said broadcast signals is detected as said one of said broadcast signals to which said tuning means is tuned during said current time period.

13. The apparatus of claim 12, wherein the means for assigning is operable to assign a highest priority for each time period to the one of said broadcast signals that is detected the greatest number of times during that time period.

14. Broadcast signal channel selecting apparatus, comprising:

means for receiving a plurality of broadcast signals;

tuning means tunable to one of said broadcast signals;

means for determining days of the week and time periods in each day;

means for assigning respective priorities to each of said broadcast signals for each time period in each day as a function of a respective amount of previous selection time of said each of said broadcast signals during said time period; and selection means operable in both an up mode and a down mode to select one of said broadcast signals having an assigned priority for a current time period of a current day immediately lower in the down mode and immediately higher in the up mode than the assigned priority of one of said broadcast signals to which said tuning means presently is tuned;

said tuning means being operable to tune to said one of said broadcast signals selected by said selection means.

15. The apparatus of claim 14, wherein said means for assigning includes detection means for detecting at predetermined time intervals during said current time period one of said broadcast signals to which said tuning means is tuned, and means for assigning a respective priority to each of said broadcast signals as a function of the number of times said each of said broadcast signals is detected as said one of said broadcast signals to which said tuning means is tuned during said current time period.

16. The apparatus of claim 15, wherein the means for assigning is operable to assign a highest priority for each time period to the one of said broadcast signals that is detected the greatest number of times during that time period.

17. The apparatus of claim 14, wherein said broadcast signals include video and audio signals, and the output from said tuning means includes a video signal and an audio signal.

18. The apparatus of claim 1, wherein said means for assigning further identifies each of said broadcast signals as a high priority broadcast signal or a low priority broadcast signal; and said selection means is operable to select one of said high priority broadcast signals having a carrier frequency higher than a carrier frequency of said broadcast signal to which said tuning means is tuned, and is further operable to select one of said high priority broadcast signals having a carrier frequency lower than the carrier frequency of said broadcast signal to which said tuning means is tuned.

* * * * *